United States Patent
Nakano et al.

(10) Patent No.: US 8,423,842 B2
(45) Date of Patent: Apr. 16, 2013

(54) TEST APPARATUS AND TEST METHOD FOR TESTING A MEMORY DEVICE

(75) Inventors: Rikizo Nakano, Kawasaki (JP); Osamu Ishibashi, Kawasaki (JP); Sadao Miyazaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 344 days.

(21) Appl. No.: 12/782,332

(22) Filed: May 18, 2010

(65) Prior Publication Data

US 2010/0313086 A1 Dec. 9, 2010

(30) Foreign Application Priority Data

Jun. 3, 2009 (JP) ................................. 2009-134345

(51) Int. Cl.
  *G11C 29/00* (2006.01)
(52) U.S. Cl.
  USPC ........................................................ 714/721
(58) Field of Classification Search .................. None
  See application file for complete search history.

(56) References Cited

U.S. PATENT DOCUMENTS

| | | | | |
|---|---|---|---|---|
| 5,051,998 | A | * | 9/1991 | Murai et al. .................... 714/762 |
| 5,200,923 | A | * | 4/1993 | Sekiguchi ................... 365/185.2 |
| 5,436,913 | A | * | 7/1995 | Yamamura et al. ............ 714/719 |
| 5,969,993 | A | * | 10/1999 | Takeshima ................ 365/185.29 |
| 6,169,691 | B1 | * | 1/2001 | Pasotti et al. ............. 365/185.25 |
| 6,233,705 | B1 | * | 5/2001 | Umeno .......................... 714/718 |
| 6,522,567 | B2 | * | 2/2003 | Iwanari .......................... 365/145 |
| 6,961,881 | B2 | * | 11/2005 | Yamazaki et al. ............. 714/718 |
| 7,126,366 | B2 | * | 10/2006 | Ohashi et al. ............. 324/762.01 |
| 7,350,123 | B2 | * | 3/2008 | Takizawa ....................... 714/734 |
| 7,882,408 | B1 | * | 2/2011 | Choe et al. ..................... 714/719 |
| 8,156,403 | B2 | * | 4/2012 | Shalvi et al. ................... 714/764 |
| 2001/0040832 | A1 | | 11/2001 | Rieger et al. |
| 2003/0070118 | A1 | * | 4/2003 | Nakao et al. ..................... 714/30 |

(Continued)

FOREIGN PATENT DOCUMENTS

| | | |
|---|---|---|
| JP | 8-263997 A | 10/1996 |
| JP | 2005-243232 A | 9/2005 |

(Continued)

OTHER PUBLICATIONS

Yamada, R.; Sekiguchi, T.; Okuyama, Y.; Yugami, J.; Kume, H.; , "A novel analysis method of threshold voltage shift due to detrap in a multi-level flash memory," VLSI Technology, 2001. Digest of Technical Papers. 2001 Symposium on , vol., no., pp. 115-116, 2001.*
Japanese Office Action dated Dec. 25, 2012, issued in correesponding Japanese Patent Application No. 2009-134345, with Partial English translation (5 pages).

*Primary Examiner* — Cynthia Britt
*Assistant Examiner* — Daniel McMahon
(74) *Attorney, Agent, or Firm* — Westerman, Hattori, Daniels & Adrian, LLP (57) ABSTRACT

A test apparatus for testing a memory device including a memory cell. The test apparatus includes a storage and a controller. The storage stores a first value. The controller executes, at a given timing, determining a second value which is a threshold limit value to read data of the memory cell correctly on the basis of an output of the memory cell, calculating a difference between the first value and the second value, outputting a deterioration information on the basis of the difference between the first value and the second value, and updating the first value stored in the storage to the second value.

15 Claims, 11 Drawing Sheets

U.S. PATENT DOCUMENTS

| | | | |
|---|---|---|---|
| 2008/0077827 A1* | 3/2008 | Ishizuka | 714/710 |
| 2008/0151667 A1* | 6/2008 | Miu et al. | 365/206 |
| 2008/0189588 A1* | 8/2008 | Tanaka et al. | 714/764 |
| 2008/0263414 A1 | 10/2008 | Saito et al. | |
| 2009/0323412 A1* | 12/2009 | Mokhlesi et al. | 365/185.02 |

FOREIGN PATENT DOCUMENTS

| | | |
|---|---|---|
| JP | 2006-127582 A | 5/2006 |
| JP | 2008-84425 A | 4/2008 |
| JP | 2008-269669 A | 11/2008 |

* cited by examiner

CHANGE OF INTERNAL SIGNAL LEVEL (WL/BL)
CHANGE OF SUBSTRATE VOLTAGE (WRITE LEVEL)

FIG. 7

CHANGE OF INTERNAL PULSE WIDTH (WRITE LEVEL)

FIG. 8

CHANGE OF SELF-REFRESH TIME
(MEMORY CELL MARGIN)

FIG. 9

POWER SUPPLY REGULATION OFF
(NOISE MARGIN)

RELATED ART

TEST APPARATUS AND TEST METHOD FOR TESTING A MEMORY DEVICE

CROSS-REFERENCE TO RELATED APPLICATIONS

This application is based upon and claims the benefit of priority of the prior Japanese Patent Application No. 2009-134345, filed on Jun. 3, 2009, the entire contents of which are incorporated herein by reference.

FIELD

The embodiments discussed herein are related to a test apparatus and a test method for performing a memory test.

BACKGROUND

Conventionally, a memory operation is guaranteed by performing a memory operation test to detect error bits, and rejecting the error bits. Such a memory operation test is performed before shipping the memory per unit of memory.

Specifically, a memory control apparatus connected to the memory generates a predetermined test pattern, operates the memory on the basis of the generated test pattern, and performs a plurality of test items. When the memory has passed the test items, the memory which has passed the test items is shipped and installed in an information processing system.

Figure 15:
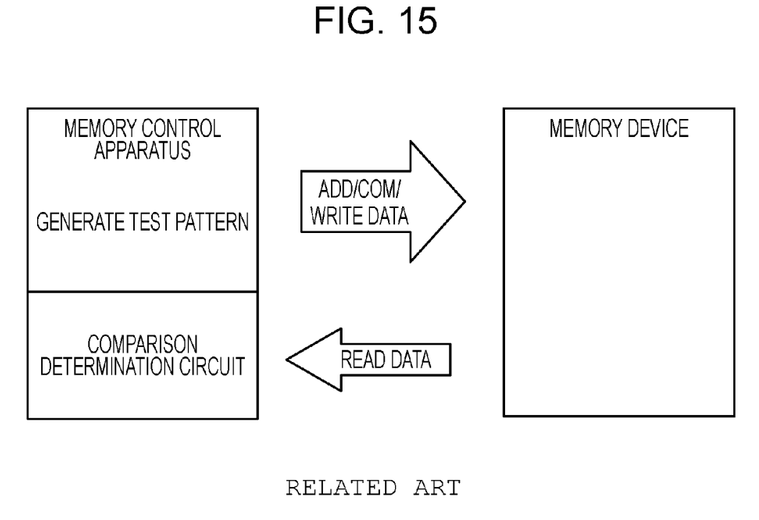
FIG. 15 is a diagram for explaining a conventional technique.

An example of a conventional memory test will be described specifically with reference to FIG. 15. FIG. 15 is a diagram for explaining a conventional technique. As illustrated in FIG. 15, the memory control apparatus generates a predetermined test pattern and transmits a data write address (shown as "ADD" in FIG. 15), a command for write instruction (shown as "COM" in FIG. 15), and write data to the memory device to be tested. Thereafter, the memory device transmits read data to the memory control apparatus.

When receiving the read data, the memory control apparatus checks whether the read data is correct, and determines whether the test is passed. As a result, when the tested memory is determined to pass the test, the tested memory is shipped.

Japanese Laid-open Patent Publication No. 2008-269669 and Japanese Laid-open Patent Publication No. 2008-84425 are examples of related art.

In the above described conventional technique, a memory operation test is performed per unit of memory by using a predetermined test pattern. Therefore, although the memory has no error in the test result of the test, an error may occur after the shipment of the memory. In other words, there is a difference between an operating environment in which the test is performed and an operating environment in which the memory is actually used, and hence an error may occur after shipment of the product even though there is no error in the test result. Therefore, there is a problem that the memory operation may not be appropriately guaranteed.

SUMMARY

According to an aspect of the embodiment, a test apparatus is for testing a memory device including a memory cell. The test apparatus includes a storage and a controller. The storage stores a first value. The controller executes, at a given timing, determining a second value which is a threshold limit value to read data of the memory cell correctly on the basis of an output of the memory cell, calculating a difference between the first value and the second value, outputting a deterioration information on the basis of the difference between the first value and the second value, and updating the first value stored in the storage to the second value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments of the memory test control apparatus and the memory test control method will be described in detail with reference to the accompanying drawings.

[First Embodiment]

In the embodiment described below, a configuration and processing of the memory control apparatus according to the first embodiment will be described, and advantages of the first embodiment will be described in the end.

Figure 1:
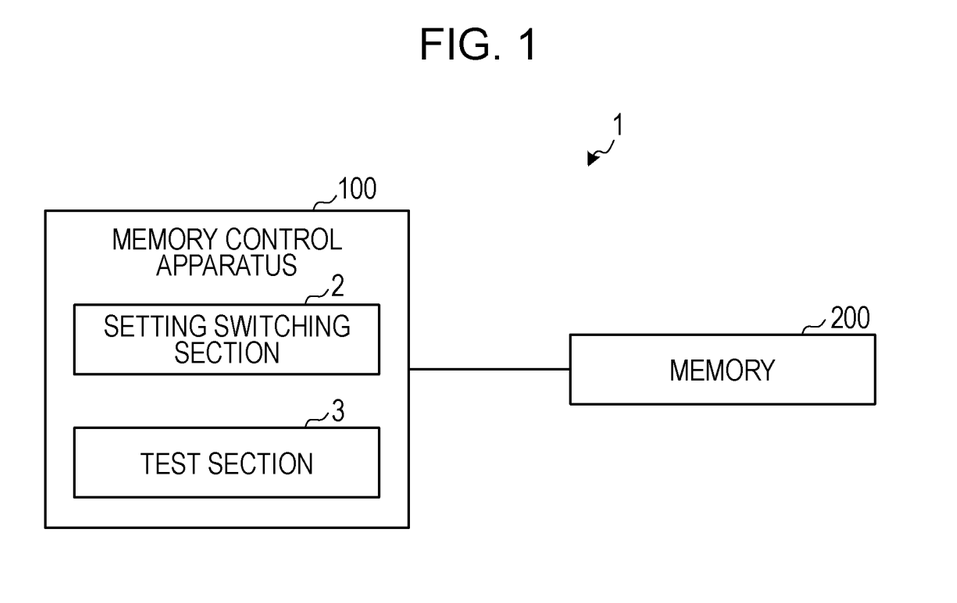
FIG. 1 is a block diagram illustrating a configuration of a memory control apparatus according to a first embodiment.

First, the configuration of the memory control apparatus according to the first embodiment will be described with reference to FIG. 1. FIG. 1 is a block diagram illustrating the configuration of the memory control apparatus according to the first embodiment. As illustrated in FIG. 1, the information processing system 1 includes the memory control apparatus 100, the memory 200, and peripheral components such as a CPU not illustrated in FIG. 1. The information processing system 1 may be a personal computer or the like.

The memory control apparatus 100 of the first embodiment controls read/write of the memory 200, starts a test mode at the system level to perform the memory test, and in particular, includes the setting switching section 2 and the test section 3.

When performing the test of the memory 200 installed in the information processing apparatus 1, the setting switching section 2 switches the setting of the operating condition to the second operating condition severer than the first operating condition which is an operating condition in the actual operating environment. The test section 3 tests the memory 200 in the second operating condition switched by the setting switching section 2.

As described above, when performing the memory test, the memory control apparatus 100 switches the setting of the operating condition to the second operating condition severer than the first operating condition which is an operating condition in the actual operating environment, and tests the memory in the switched second operating condition.

Therefore, the memory control apparatus 100 may test the memory in an environment severer than an environment of normal operation, efficiently reject memory bits having only a small operation margin, and appropriately guarantee the memory operation.

Since the memory control apparatus 100 performs the memory test while the memory 200 is installed in the information processing system 1, the memory control apparatus 100 may perform the memory test considering influences of operations of peripheral components (for example, system noise from the power supply and heat stress in the operating environment). As a result, the operation of the memory may be appropriately guaranteed.

[Second Embodiment]

Hereinafter, a configuration and a processing flow of the memory control apparatus according to a second embodiment will be described, and advantages of the second embodiment will be described in the end.

[Configuration of Information Processing Apparatus]

Figure 2:
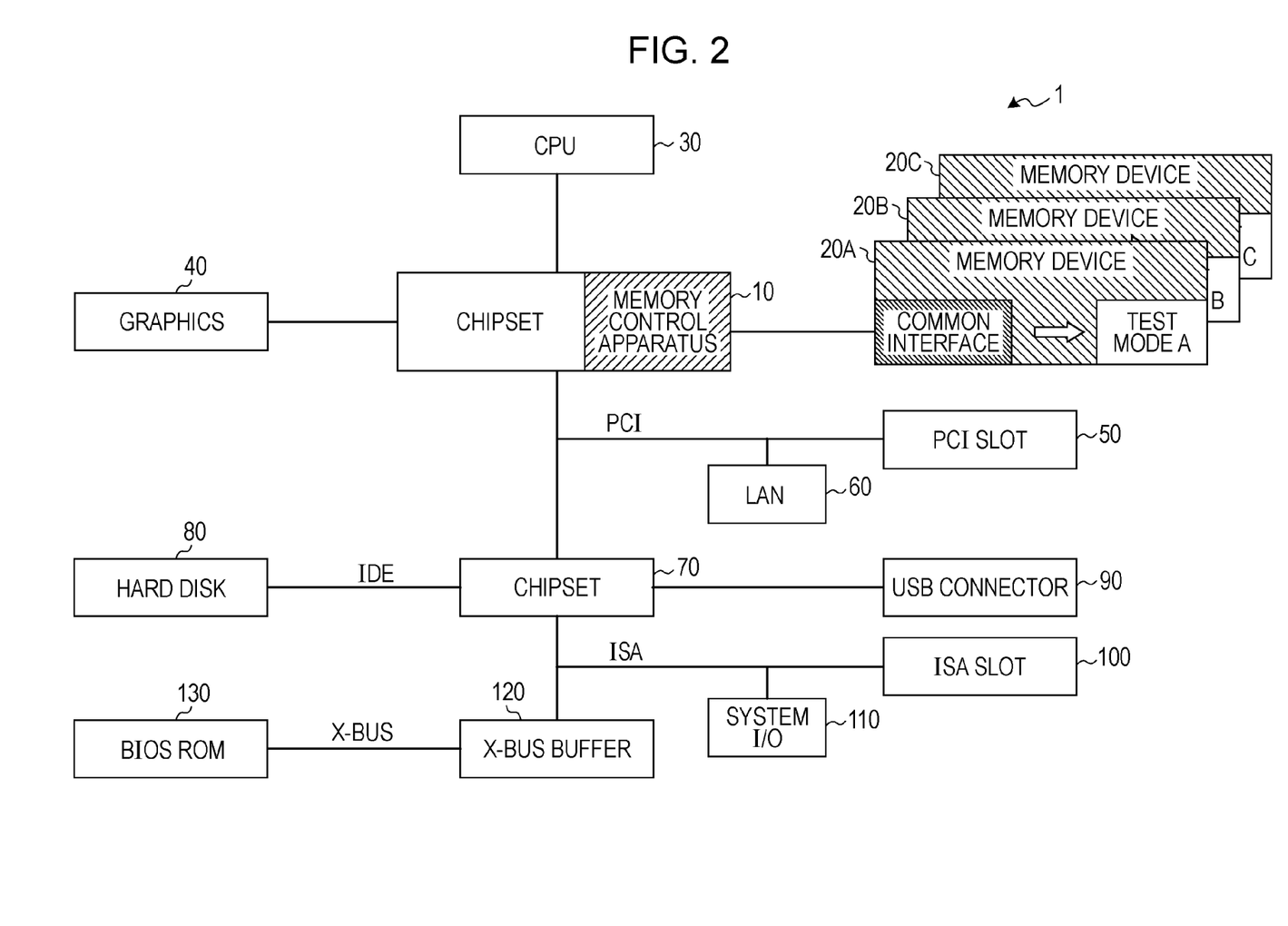
FIG. 2 is a block diagram illustrating a configuration of an information processing system according to a second embodiment.

Next, a configuration of the information processing apparatus 1 including the memory control apparatus 10 will be described with reference to FIG. 2. FIG. 2 is a block diagram illustrating the configuration of the information processing apparatus 1 according to the second embodiment. As illustrated in FIG. 2, the information processing system 1 includes the memory control apparatus 10 which performs the test of the memory devices 20, and a plurality of test target memory devices 20A to 20C.

The information processing apparatus 1 includes, as peripheral devices, a CPU 30, a graphics 40, a PCI slot 50, a LAN 60, a chipset 70, a hard disk 80, a USB connector 90, an ISA slot 100, a system I/O 110, an X-Bus buffer 120, a BIOS ROM 130, which are connected to each other via a bus or the like. Hereinafter, processing of the above sections will be described.

The memory control apparatus 10 controls read/write of the memory devices 20A to 20C, and starts a test mode to perform the test of the memory devices at the system level. Specifically, when performing the test of the memory devices 20A to 20C installed in the information processing apparatus 1, the memory control apparatus 10 switches the setting of the operating condition to the second operating condition severer than the first operating condition which is an operating condition in the actual operating environment. The memory control apparatus 10 tests the memory devices 20A to 20C in the switched second operating condition.

The memory devices 20 A to 20C are from different vendors respectively, and receive address, command, write data, and the like from the memory control apparatus 10 via the common interface. Test modes A to C are set in the memory devices 20A to 20C respectively. In other words, the memory devices 20A to 20C hold test condition setting data which is information related to the test condition.

The CPU 30 includes an internal memory for storing a program in which various processing procedures are specified and necessary data, and performs various processing using the program and the data. The graphics 40 creates graphical data by an instruction from the CPU 30, and stores the data in the memory devices 20A to 20C. Also, the graphics 40 reads the graphical data from the memory devices 20A to 20C.

The PCI slot 50 is an insertion opening for inserting a PCI-Express device such as a PCI-Express card which is an extended function card. The LAN (Local Area Network) 60 is a network through which data is transmitted and received.

The chipset 70 manages transmission/reception of data transmitted/received among the CPU 30, the memory control apparatus 10, and the like. The hard disk 80 is a storage apparatus for storing data. The USB (Universal Serial Bus) connector 90 is a connector for connecting to an auxiliary storage apparatus from/to which data is read/written.

The ISA (Industrial Standard Architecture) slot 100 is an expansion slot. The system I/O 110 inputs/outputs data inside/outside the system. The X-bus buffer 120 is a buffer for temporarily holding data transmitted from the X-Bus. The BIOS (Basic Input Output System) ROM 130 is a storage apparatus for storing a program for controlling peripheral devices connected to the computer.

Figure 3:
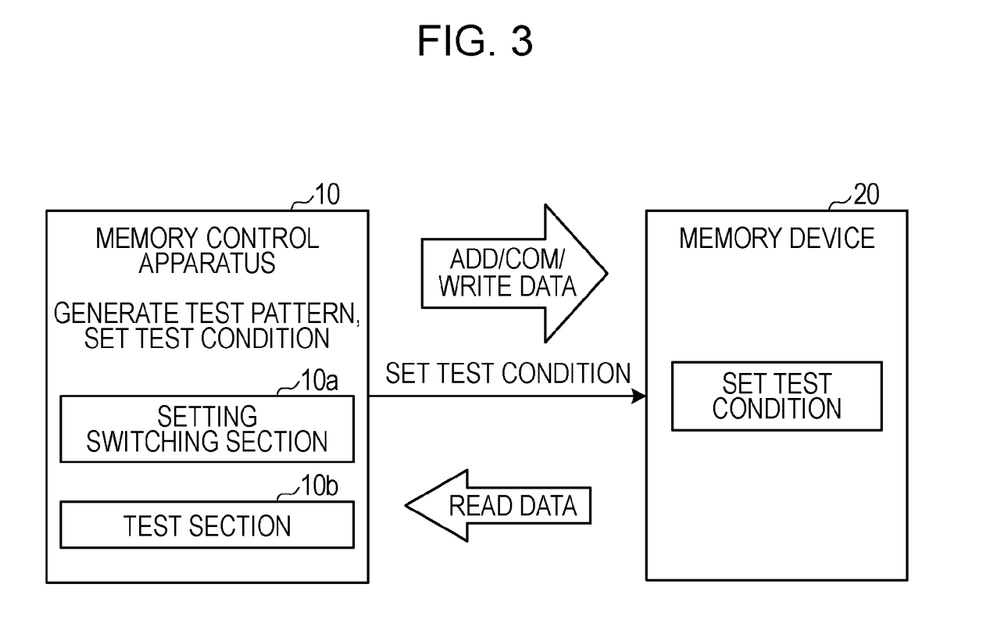
FIG. 3 is a diagram for explaining test processing of the memory control apparatus and memory devices in the information processing system according to the second embodiment.

Here, test processing of the memory control apparatus and the memory devices in the information processing system according to the second embodiment will be described with reference to FIG. 3. FIG. 3 is a diagram for explaining the test processing of the memory control apparatus and the memory devices in the information processing system according to the second embodiment.

As illustrated in FIG. 3, the memory control apparatus 10 generates a test pattern and sets a predetermined test condition. The memory control apparatus 10 transmits the set test condition to the memory devices 20. The test condition is an operating condition for testing which is severer than an operating condition in the actual operating environment.

Thereafter, the memory control apparatus 10 transmits a data write address or a data read address (shown as "ADD" in FIG. 3), a command for write instruction or read instruction (shown as "COM" in FIG. 3), and write data to the memory device 20 to be tested. Thereafter, when performing read processing, the memory device 20 transmits read data to the memory control apparatus 10.

When receiving the read data, the memory control apparatus 10 determines whether the test at a second determination level which is a read level for testing is passed or not. As a result, when the test at the second determination level is not passed, the memory control apparatus 10 rejects the bits of the memory device 20 which has been tested. When the test at the second determination level is determined to be passed by a determination circuit, the determination level is restored to a normal first determination level, and the memory device 20 is shipped.

For example, as a test at the second determination level, the memory control apparatus 10 performs write processing by using a voltage lower than a normal write voltage, and detects weak bits that are out of normal distribution. Therefore, the memory control apparatus 10 may test the memory in an environment severer than an environment of normal operation, and appropriately guarantee the memory operation.

Here, the configuration of the memory control apparatus will be described. As illustrated in FIG. 3, the memory control apparatus 10 controls read/write of the memory device 20, starts a test mode at the system level to perform the memory test, and in particular, includes the setting switching section 10a and the test section 10b.

When performing the test of the memory device 20 installed in the information processing apparatus 1, the setting switching section 10a switches the setting of the operating condition to the second operating condition severer than the first operating condition which is an operating condition in the actual operating environment.

Specifically, when performing a read test of the memory device 20 installed in the information processing apparatus 1, the setting switching section 10a switches a setting of read level of the memory device 20 to the second determination level severer than the first determination level which is used in the actual operating environment.

When performing a write test of the memory device 20 installed in the information processing apparatus 1, the setting switching section 10a switches a setting of write level of the memory device 20 to the second write level lower than the first write level which is used in the actual operating environment.

The test section 10b tests the memory device 200 in the second operating condition switched by the setting switching section 10a. Specifically, when performing the read test of the memory device 20, the test section 10b tests the read processing of the memory by using the switched second determination level. When performing the write test of the memory device 20, the test section 10b tests the write processing of the memory device 20 by using the second write level.

Figure 4:
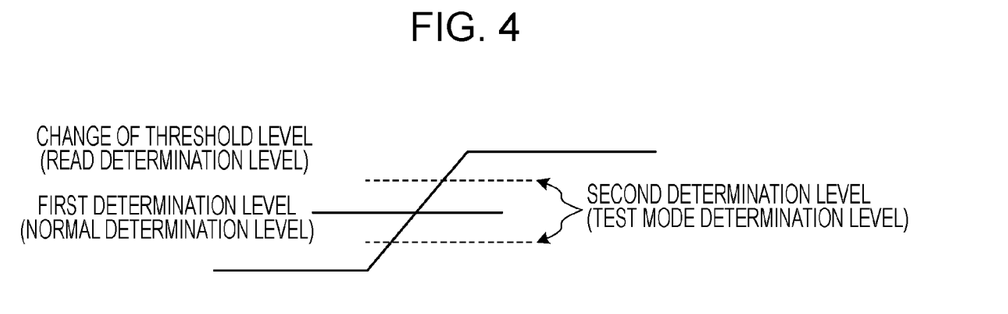
FIG. 4 is a diagram illustrating a test example of a test mode.

Here, a test example of the memory will be described with reference to FIGS. 4 to 9. FIGS. 4 to 9 are diagrams illustrating a test example of a test mode. For example, as illustrated in FIG. 4, when performing the read test of the memory device 20, the memory control apparatus 10 changes a threshold level which is the read determination level to the second determination level severer than the first determination level which is used in the actual operating environment.

The memory control apparatus 10 receives read data from the memory device 20 and determines whether the read data exceeds the threshold level. As a result, when the read data exceeds the second determination level which is the threshold level, the memory control apparatus 10 determines that the test is passed.

Figure 5:
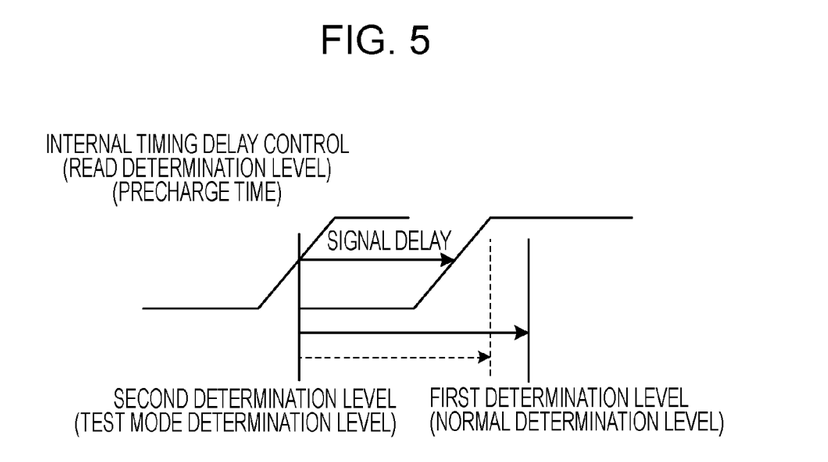
FIG. 5 is a diagram illustrating a test example of a test mode.

As illustrated in FIG. 5, when performing the read test of the memory device 20, the memory control apparatus 10 sets a delay time (latency) for reading or writing data from or to the memory device 20 by an analogue value, and detects a signal delay time. The memory control apparatus 10 determines whether the signal delay time exceeds the second determination level severer than the first determination level which is used in the actual operating environment. As a result, when the signal delay time does not exceed the second determination level, the memory control apparatus 10 determines that the test is passed.

Figure 6:
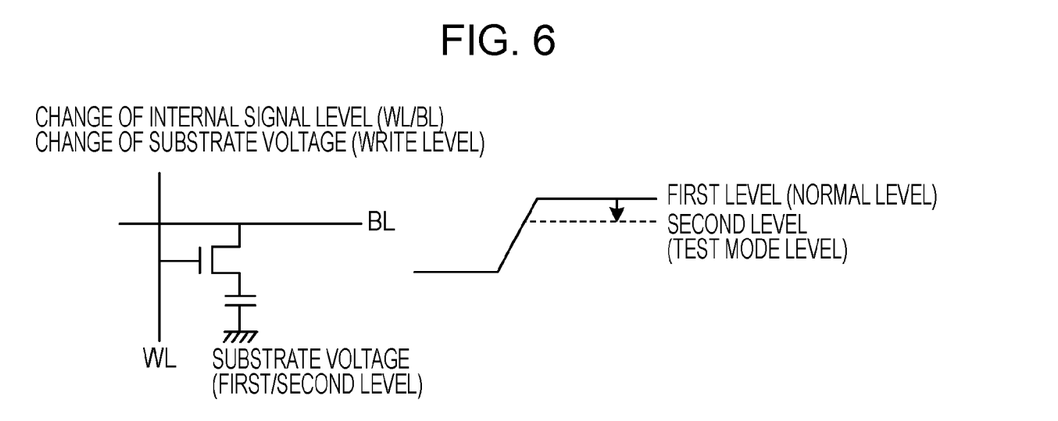
FIG. 6 is a diagram illustrating a test example of a test mode.

As illustrated in FIG. 6, when performing the write test of the memory device 20, the memory control apparatus 10 changes an internal signal level which is a write voltage (internal voltage) or changes a substrate voltage, and controls so that an amplitude level becomes small. As a result, write processing using a voltage lower than that in a normal write operation is performed.

The memory control apparatus 10 reads written data, and determines whether the data is appropriately written. As a result, when the data is appropriately written, the memory control apparatus 10 determines that the test is passed.

Figure 7:
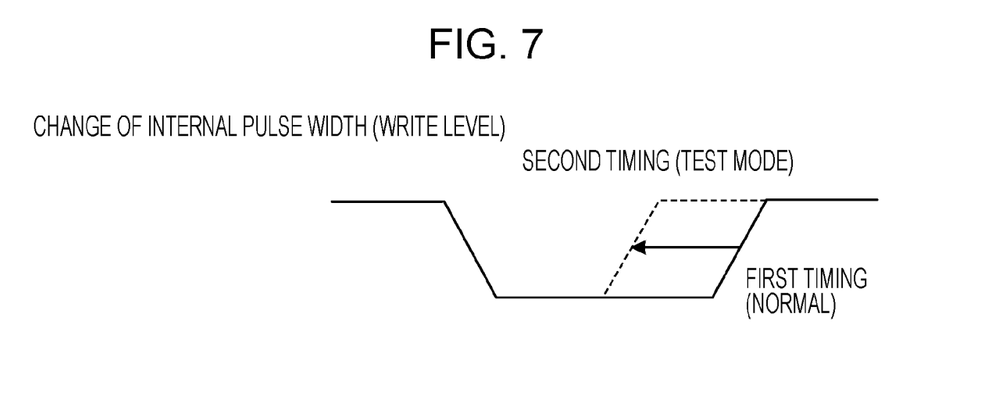
FIG. 7 is a diagram illustrating a test example of a test mode.

As illustrated in FIG. 7, when performing the write test of the memory device 20, the memory control apparatus 10 changes an internal timing pulse width, and controls so that the pulse width becomes narrower than that in a normal write operation. As a result, write processing using an internal timing pulse weaker than that in a normal write operation is performed.

The memory control apparatus 10 reads written data, and determines whether the data is appropriately written. As a result, when the data is appropriately written, the memory control apparatus 10 determines that the test is passed.

Figure 8:
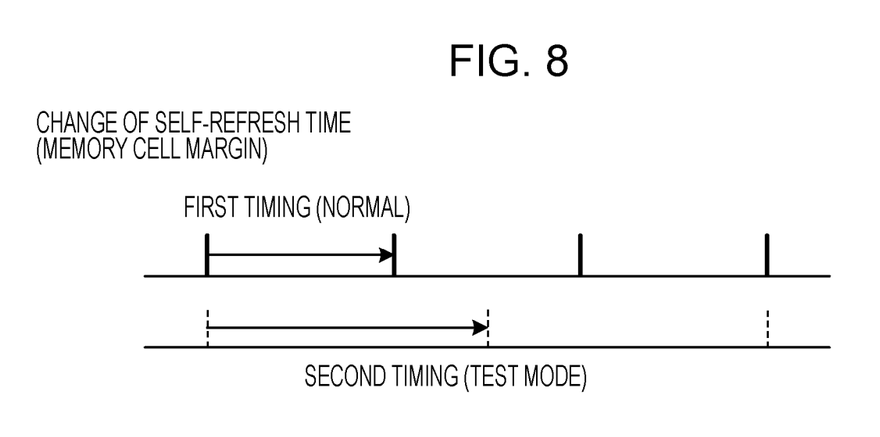
FIG. 8 is a diagram illustrating a test example of a test mode.

As illustrated in FIG. 8, in the test mode, the memory control apparatus 10 tests whether the memory device 20 operates correctly while a self-refresh time is changed to be longer than that in a normal operation.

Figure 9:
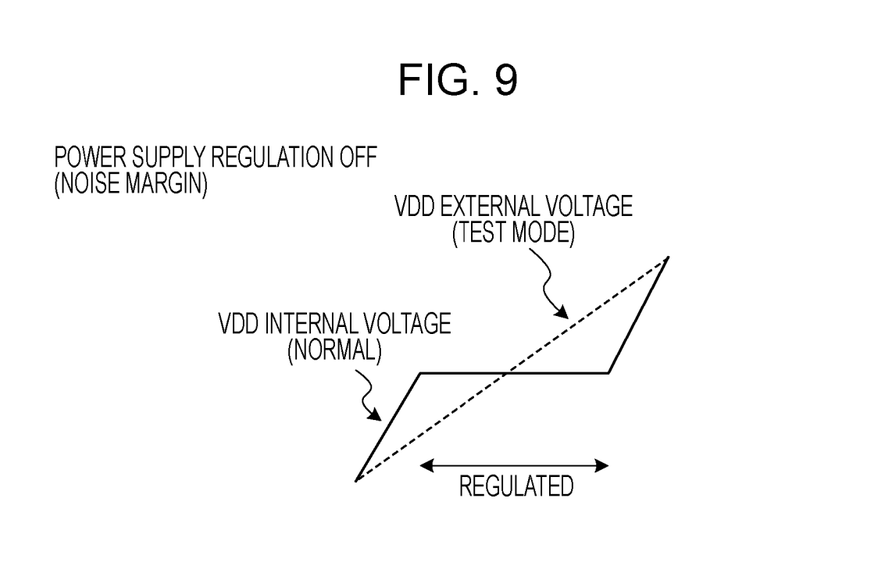
FIG. 9 is a diagram illustrating a test example of a test mode.

As illustrated in FIG. 9, in a normal mode, the memory control apparatus 10 turns on regulation of the power supply and converts the VDD external voltage into the VDD internal voltage. However, in the test mode, the memory control apparatus 10 turns off the regulation of the power supply, and tests whether the memory device 20 performs write operation correctly by the VDD external voltage.

Figure 10:
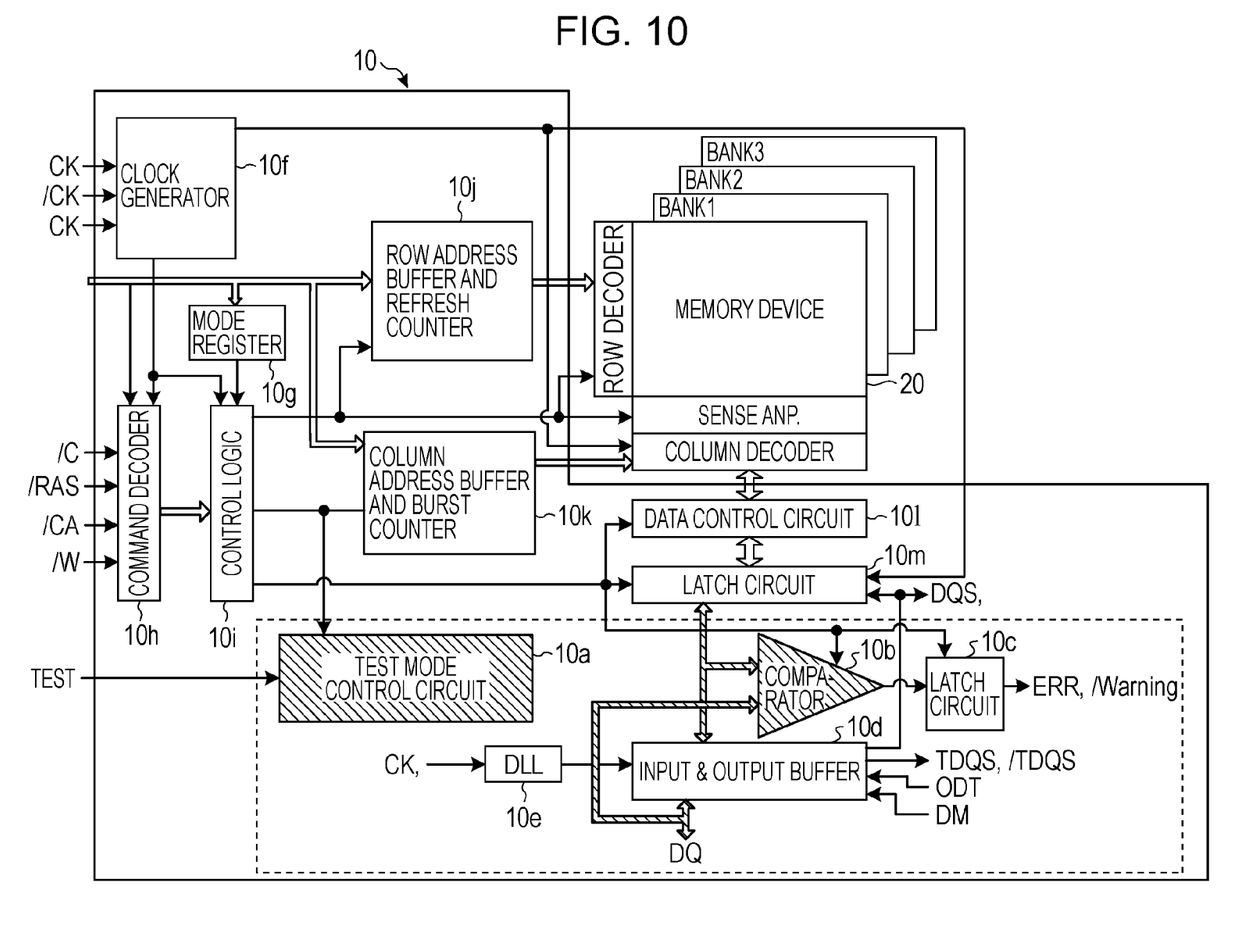
FIG. 10 is a block diagram illustrating a circuit configuration of the memory control apparatus according to the second embodiment.

Next, a circuit configuration of the memory control apparatus 10 will be described with reference to FIG. 10. As illustrated in FIG. 10, the memory control apparatus 10 includes the test mode control circuit 10a, the comparator 10b, and the latch circuit 10c.

When performing the memory test, the test mode control circuit 10a controls so that the setting of the operating condition is changed to the second operating condition severer than the first operating condition which is used in the actual operating environment.

The comparator 10b is a circuit which compares and determines two data, and tests the memory by using the second determination level switched by the setting switching section 2. Specifically, when the comparator 10b receives read data from the memory device 20 via the data control circuit 10l and the latch circuit 10m, the comparator 10b compares the read data with the second determination level, and determines whether the test is passed.

The latch circuit 10c holds the test result, and outputs an output signal such as an alarm or an error in accordance with the test result. In this way, the latch circuit 10c outputs an alarm and gives notice of the bits having only a small operation margin, so that it is possible to take appropriate action such as part replacement before the system breaks down.

The memory control apparatus 10 includes the I/O buffer 10d, the DLL 10e, the clock generator 10f, the mode register 10g, the command decoder 10h, the control logic 10i, the row address buffer and refresh counter 10j, the column address buffer and burst counter 10k, the data control circuit 10l, and the latch circuit 10m.

The I/O buffer 10d holds an output of the memory and causes the memory control apparatus 10 to receive a DQ signal, which is a data signal. In the DLL 10e, a delay device adds a delay amount to a phase of inputted signal, and a delay signal whose phase is delayed from the phase of the inputted signal is outputted. The clock generator 10f generates a clock signal and synchronizes operations of each constituent element.

The mode register 10g is a register in which a processing mode that indicates whether the current mode is the normal operation mode or the test mode is set. The processing mode is set in the mode register 10g by the CPU 30. The command decoder 10h decodes an inputted command signal into an internal command signal. The control logic 10i generates an interrupt signal in accordance with the clock signal outputted by the clock generator 10f.

The row address buffer and refresh counter 10j receive and hold a row address, and refresh the held data. The column address buffer and burst counter 10k receive and hold a column address, and count the length of data which is burst-transferred.

The data control circuit 10l controls read/write processing from/to the memory device 20. The latch circuit 10m temporarily stores data which is stored in the memory device 20.

[Processing by the Memory Control Apparatus]

Figure 11:
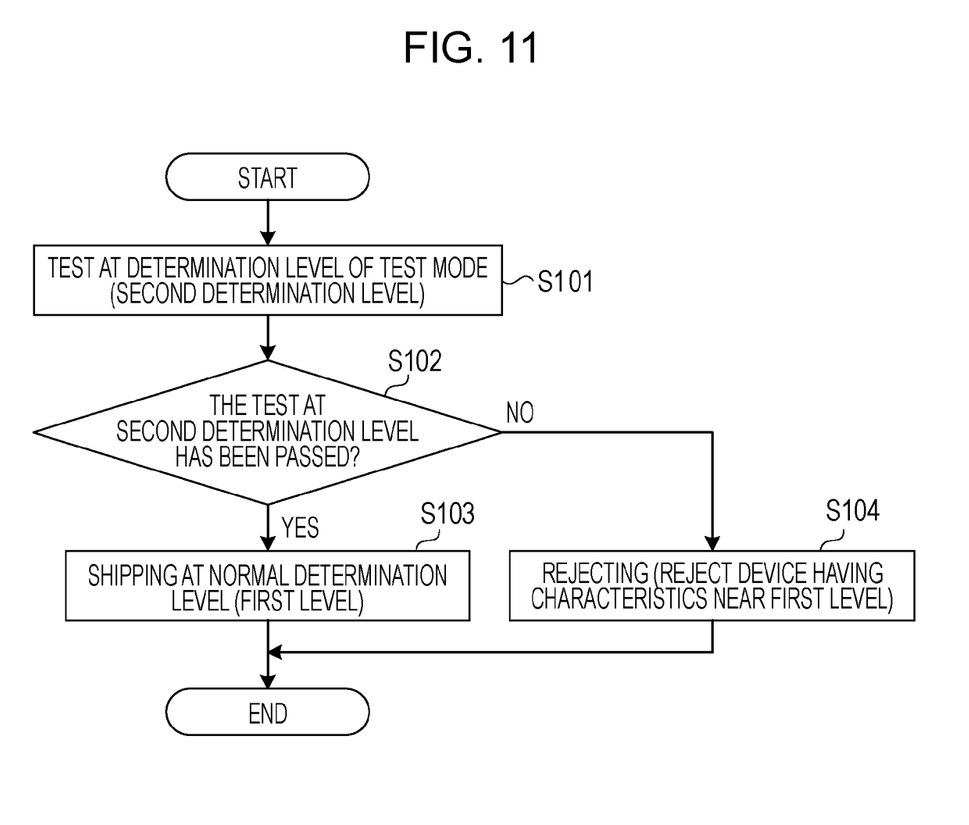
FIG. 11 is a flowchart illustrating a processing operation of the memory control apparatus according to the second embodiment.
Figure 12:
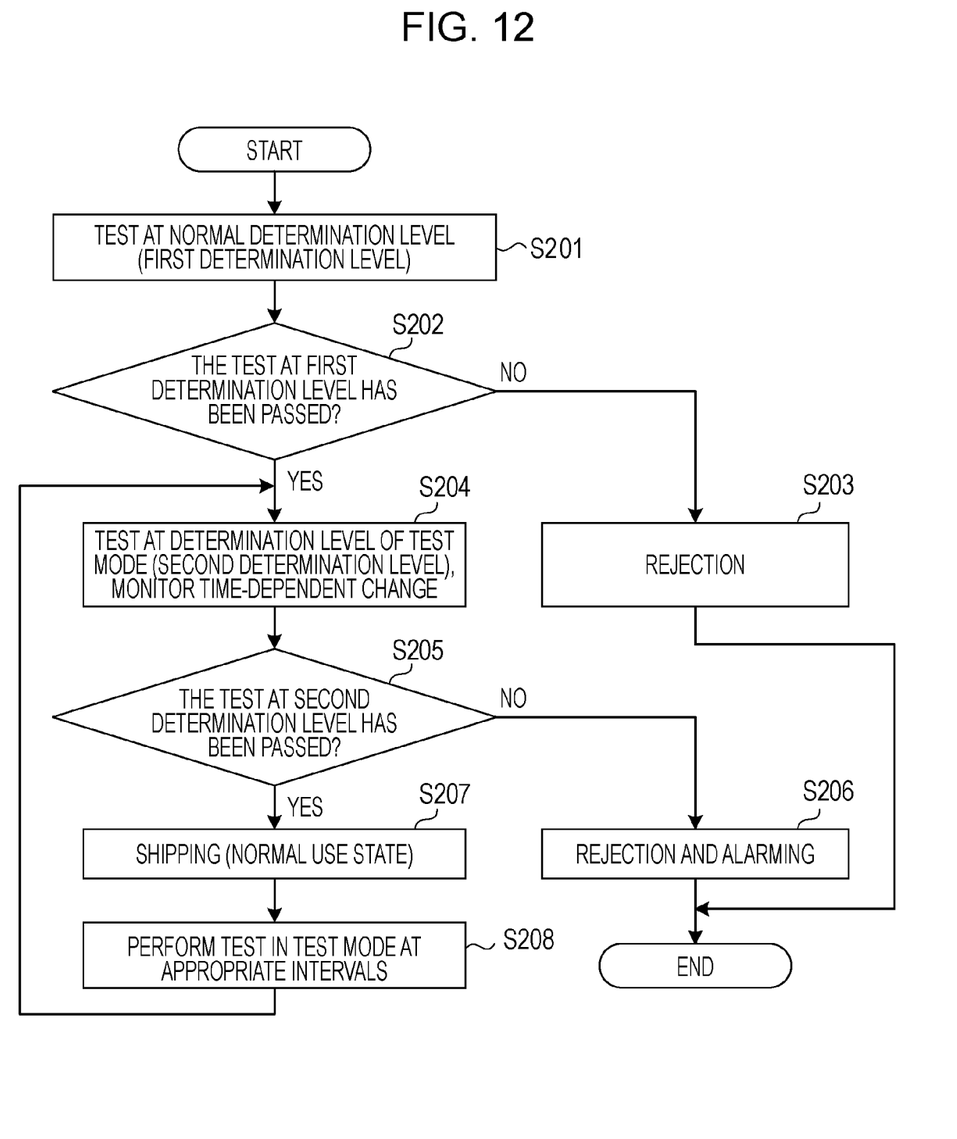
FIG. 12 is a flowchart illustrating a processing operation of the memory control apparatus according to the second embodiment.
Figure 13:
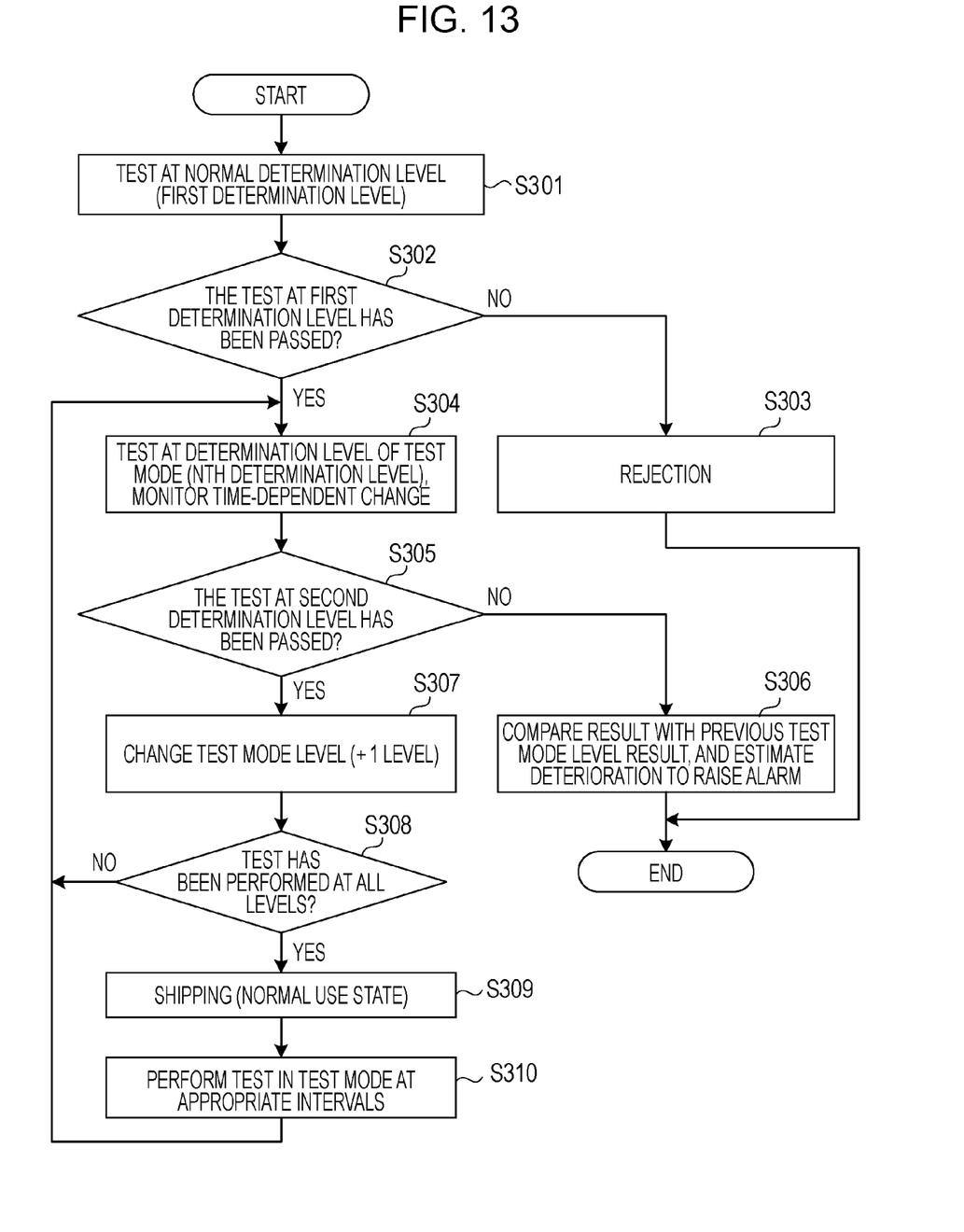
FIG. 13 is a flowchart illustrating a processing operation of the memory control apparatus according to the second embodiment.

Next, the processing by of the memory control apparatus 10 according to the second embodiment will be described with reference to FIGS. 11 to 13. FIGS. 11 to 13 are flowcharts illustrating a processing operation of the memory control apparatus 10 according to the second embodiment.

As illustrated in FIG. 11, when performing the test of the memory device 20, the memory control apparatus 10 switches the setting of the operating condition to the test mode (the second determination level) severer than the first determination level which is used in the actual operating environment, and tests the memory device 20 (step S101).

Then, the memory control apparatus 10 determines whether the test is passed or not (step S102), and when the test at the second determination level is not passed (No in step S102), the memory control apparatus 10 rejects the bits of the test target memory device 20 (step S104). When the test at the second determination level is determined to be passed (Yes in step S102), the determination level is restored to the normal first determination level, and the memory device 20 is shipped (step S103).

Next, with reference to FIG. 12, processing will be described in which the memory control apparatus 10 performs the test by detecting a decrease in the signal level or a delay of the signal due to a time-dependent change of the memory device 20. As illustrated in FIG. 12, the memory control apparatus 10 tests the memory device 20 at the first termination level which is used in the normal operation (step S201).

Then, the memory control apparatus 10 determines whether the test is passed or not (step S202), and when the test at the first determination level is not passed (No in step S202), the memory control apparatus 10 rejects the bits of the test target memory device 20 (step S203).

When the test at the first determination level is passed (Yes in step S202), the memory control apparatus 10 switches the setting of the operating condition to the test mode (the second determination level) severer than the first determination level which is used in the normal operation, tests the memory device 20, and monitors a time-dependent change (step S204).

Then, the memory control apparatus 10 determines whether the test at the second determination level is passed or not (step S205), and when the test at the second determination level is not passed (No in step S205), the memory control apparatus 10 rejects the bits of the test target memory device 20, and outputs an alarm (step S206). In this way, by outputting an alarm and giving notice of the bits having only a small operation margin, it is possible to take appropriate action such as part replacement before the system breaks down.

When the test at the second determination level is passed (Yes in step S205), the memory control apparatus 10 restores the determination level to the first determination level which is used in the normal operation, and enables the shipment of the memory device 20 (step S207).

Thereafter, the memory control apparatus 10 performs the test at the second determination level of the test mode at appropriate time intervals (step S208), returns to step S204, and repeats processing to monitor the time-dependent change (steps S204 to S208). For example, if the memory control apparatus 10 is mounted in a personal computer, the memory control apparatus 10 may perform the test on computer's start-up process.

Next, with reference to FIG. 13, processing will be described in which the memory control apparatus 10 determines the results of a plurality of test conditions, and performs the test by detecting a decrease in the signal level or a delay of the signal due to a time-dependent change of the memory device 20. As illustrated in FIG. 13, the memory control apparatus 10 tests the memory device 20 at the first termination level which is used in the normal operation (step S301).

Then, the memory control apparatus 10 determines whether the test is passed or not (step S302), and when the test at the first determination level is not passed (No in step S302), the memory control apparatus 10 rejects the bits of the test target memory device 20 (step S303).

When the test at the first determination level is passed (Yes in step S302), the memory control apparatus 10 switches the test mode setting to the test mode whose test mode level is "n" which is selected from a plurality of test mode levels, tests the memory device 20, and monitors a time-dependent change (step S304). The test mode level is stored in storage like a flash memory. The storage may be provided in the memory control apparatus 10 or other storage section in the information processing system 1.

Then, the memory control apparatus 10 determines whether the test at the second determination level is passed or not (step S305), and when the test at the second determination level is not passed (No in step S305), the memory control apparatus 10 compares the current test mode level result with the previous test mode level result, estimates deterioration, and outputs an alarm as a deterioration information (step S306). That is to say, the memory control apparatus 10 may outputs an alarm on the basis of the difference in a threshold limit value between the current test and the previous test. The threshold limit value is defined as a limiting determination level to read data of the memory cell correctly.

When the test at the second determination level is passed (Yes in step S305), the memory control apparatus 10 raises the test mode level by "1" to change the test mode level (step S307), and determines whether the test has been performed at all the test mode levels (step S308). When the test at n determination level is passed, the memory control apparatus 10 raises the test mode level to n+1 determination level and uploads the test mode level (for example n−1 determination level) stored in the storage to the n determination level.

As a result, when the memory control apparatus 10 determines that the test has not been performed at all the test mode levels (No in step S308), the memory control apparatus 10 returns to step S304, and repeats processing to perform the test at the second determination level (steps S304 to S308).

When the memory control apparatus 10 determines that the test has been performed at all the test mode levels (Yes in step S308), the memory control apparatus 10 restores the determination level to the first determination level which is used in the normal operation, and enables the shipment of the memory device 20 (step S309).

Thereafter, the memory control apparatus 10 performs the test at the second determination level of the test mode at appropriate time intervals (step S310), returns to step S304, and repeats processing to monitor the time-dependent change (steps S304 to S310). For example, if the memory control apparatus 10 is mounted in a personal computer, the memory control apparatus 10 may perform the test on computer's start-up process.

[Advantages of the Second Embodiment]

As described above, when performing the test of the memory device 20, the memory control apparatus 10 switches the setting of the operating condition to the second operating condition severer than the first operating condition which is an operating condition in the actual operating environment, and tests the memory device 20 in the switched second operating condition. Therefore, the memory control apparatus 10 may test the memory device 20 in an environment severer than an environment of normal operation, efficiently reject the bits of the memory device 20 having only a small operation margin, and appropriately guarantee the operation of the memory device 20.

Since the memory control apparatus 10 performs the test of the memory device 20 while the memory device 20 is installed in the information processing system 1, the memory control apparatus 10 may perform the test of the memory device 20 considering influences of operations of peripheral components (for example, system noise from the power supply and heat stress in the operating environment). As a result, the operation of the memory device 20 may be appropriately guaranteed.

According to the second embodiment, when performing the read test of the memory device 20 installed in the information processing apparatus 1, the memory control apparatus 10 switches the setting of read level of the memory device 20 to the second determination level severer than the first determination level which is used in the actual operating environment. Then, the memory control apparatus 10 tests the read processing of the memory device 20 by using the switched second determination level. Therefore, the memory control apparatus 10 may test the read processing of the memory device 20 in an environment severer than an environment of normal operation, efficiently reject the bits of the memory device 20 having only a small operation margin, and appropriately guarantee the operation of the memory device 20.

According to the second embodiment, when performing the write test of the memory device 20 installed in the information processing apparatus 1, the memory control apparatus 10 switches the setting of write level of the memory device 20 to the second write level lower than the first write level which is used in the actual operating environment. Then, the memory control apparatus 10 tests the write processing of the memory device 20 by using the switched second write level. Therefore, the memory control apparatus 10 may test the write processing of the memory device 20 in an environment severer than an environment of normal operation, efficiently reject the bits of the memory device 20 having only a small operation margin, and appropriately guarantee the operation of the memory device 20.

According to the second embodiment, since the memory control apparatus 10 repeats the processing to test the memory device 20 by using the second determination level at predetermined time intervals, and monitors the time-dependent change of the memory device 20 from the test results, it is possible to detect a decrease in the signal level and a delay of the signal, efficiently reject the bits which deteriorate as time progresses, and appropriately guarantee the operation of the memory device 20.

According to the second embodiment, since the memory control apparatus 10 tests the memory device 20 in a plurality of operating conditions, and estimates the time-dependent change of the memory device 20 from the test results in each operation condition, it is possible to predict the bits which deteriorate as time progresses, and take appropriate action such as part replacement before the system down occurs.

[Third Embodiments]

Although the embodiments have been described, the apparatus and the method may be implemented in various forms in addition to the embodiments described above. Therefore, hereinafter, other embodiments will be described as the third embodiments.

(1) Processing Load Determination

Although, in the second embodiment described above, a case in which the memory control apparatus reads data from the memory to perform the test is described, the test may be performed in the memory. The memory includes a determination circuit to perform the test (the circuit group enclosed by a dotted line in FIG. 10).

Figure 14:
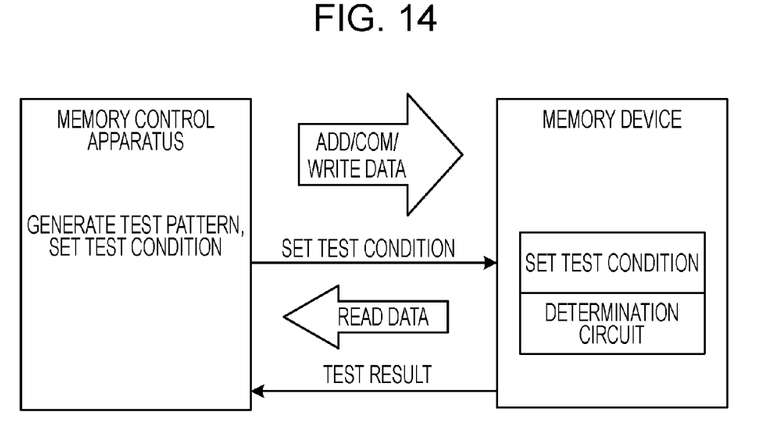
FIG. 14 is a diagram for explaining test processing of the memory control apparatus and the memory device in the information processing system according to the third embodiment.

Here, the test processing of the memory control apparatus and the memory device will be described. For example, as illustrated in FIG. 14, the memory control apparatus generates a test pattern and sets a predetermined test condition. Then, the memory control apparatus 10 transmits the set test condition to the memory devices 20.

Thereafter, the memory control apparatus 10 transmits a data write address or a data read address (shown as "ADD" in FIG. 3), a command for write instruction or read instruction (shown as "COM" in FIG. 3), and write data to the memory device 20 to be tested.

The memory device determines whether the test at the second determination level which is the read level for testing is passed or not in the memory device. Then, the memory device transmits the test result indicating whether the test is passed or not to the memory control apparatus. Thereafter, when the test at the second determination level is not passed, the memory control apparatus 10, which receives the test result, rejects the bits of the memory device 20 which has been tested. When the test at the second determination level is determined to be passed by the determination circuit, the determination level is restored to the normal first determination level, and the memory device 20 is shipped.

(2) System Configuration

The constituent elements of each apparatus illustrated in the figures are functionally conceptual, and need not necessarily be physically configured as illustrated in the figures. In other words, specific forms of distribution and integration of each apparatus are not limited to those illustrated in the figures, and all or part of the apparatuses may be functionally or physically distributed or integrated in arbitrary units according to various loads and the state of use. For example, the setting switching section 10a and the test section 10b may be integrated. Moreover, all or an arbitrary part of the processing functions performed in each apparatuses may be realized by a CPU and a program analyzed and executed by the CPU, or may be realized as hardware by wired logic.

(3) Program

The memory test control method described in the embodiment may be realized by executing a program prepared in advance by a computer such as a personal computer or a workstation. The program may be distributed via a network such as the Internet. The program may be stored in a computer-readable recording medium, such as a hard disk, a flexible disk (FD), a CD-ROM, an MO, and a DVD, and may also be executed by being read from the recording medium by the computer.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A test apparatus for testing a memory device including a memory cell, the test apparatus comprising:
   a storage to store a first value; and
   a controller configured to execute at a given timing to include:
      determining a second value which is a threshold limit value to read data of the memory cell correctly on the basis of an output of the memory cell;
      calculating a difference between the first value and the second value;
      outputting a deterioration information on the basis of the difference between the first value and the second value; and
      updating the first value stored in the storage to the second value, wherein
   in determining the second value, the controller is configured to repeat an operation including:
      setting a read parameter to the memory device;
      writing data to the memory cell using a write parameter which is set in the memory device;
      reading the data of the memory cell on the basis of the output from the memory cell using the read parameter;
      judging whether or not the data of the memory cell which is read using the read parameter is correct; and
      changing a value of the read parameter, when the data of the memory cell is judged to be correct, so that the value of the read parameter deviates from a threshold value provided under normal operating conditions to simulate an environment severer than an environment under the normal operating conditions under which it becomes severer to read the data of the memory cell on the basis of the output from the memory cell; and
      detecting the second value from values of the read parameter, each of which is set when the data of the memory cell is judged to be correct in the operation.

2. A test apparatus for testing a memory device including a memory cell, the test apparatus comprising:
   a storage to store a first value; and
   a controller configured to execute at a given timing to include:
      determining a second value which is a threshold limit value to read data of the memory cell correctly on the basis of an output of the memory cell;
      calculating a difference between the first value and the second value;
      outputting a deterioration information on the basis of the difference between the first value and the second value; and
      updating the first value stored in the storage to the second value, wherein
   in determining the second value, the controller is configured to repeat an operation including:
      setting a write parameter to the memory device;
      writing data to the memory cell using the write parameter;
      reading the data of the memory cell on the basis of the output from the memory cell using a read parameter which is set in the memory device;
      judging whether or not the data of the memory cell which is read using the read parameter is correct; and
      changing a value of the write parameter, when the data of the memory cell is judged to be correct, so that the value of the write parameter deviates from a threshold value provided under normal operating conditions to simulate an environment severer than an environment under the normal operating conditions under which it becomes severer to read the data of the memory cell on the basis of the output from the memory cell; and
   detecting the second value from values of the write parameter, each of which is set when the data of the memory cell is judged to be correct in the operation.

3. The test apparatus according to claim 1, wherein the deterioration information is outputted on the basis of the difference and the second value.

4. The test apparatus according to claim 1, wherein the given timing is a timing at which the test device is started.

5. The test apparatus according to claim 1, wherein the read parameter is a threshold voltage level for determining whether or not the data read from the memory cell is correct.

6. The test apparatus according to claim 1, wherein the read parameter is a latency for reading the data of the memory cell.

7. The test apparatus according to claim 2, wherein the write parameter is a write voltage for writing the data to the memory cell.

8. The test apparatus according to claim 2, wherein the write parameter is a timing pulse width for writing the data to the memory cell.

9. The test apparatus according to claim 2, wherein the write parameter is a latency for writing the data to the memory cell.

10. A test method for testing a memory device including a memory cell, the test method comprising:
    storing a first value in a storage; and
    executing at a given timing;
       determining a second value which is a threshold limit value to read data of the memory cell correctly on the basis of an output of the memory cell;
       calculating a difference between the first value and the second value;
       outputting a deterioration information on the basis of the difference between the first value and the second value; and
       updating the first value stored in the storage to the second value, wherein
    the step of determining the second value comprises:
    repeating an operation including:
    setting a read parameter to the memory device;
    writing data to the memory cell using a write parameter which is set in the memory device;
    reading the data of the memory cell on the basis of the output from the memory cell using the read parameter;
    judging whether or not the data of the memory cell which is read using the read parameter is correct; and changing a value of the read parameter, when the data of the memory cell is judged to be correct, so that the value of the read parameter deviates from a threshold value provided under normal operating conditions to simulate an environment severer than an environment under the normal operating conditions under which it becomes severer to read the data of the memory cell on the basis of the output from the memory cell; and detecting the second value from values of the read parameter, each of which is set when the data of the memory cell is judged to be correct in the operation.

11. The test method according to claim 10, wherein the deterioration information is outputted on the basis of the difference and the second value.

12. The test method according to claim 10, wherein the given timing is set after a timing at which a test device is started.

13. The test method according to claim 10, wherein the read parameter is a threshold voltage level for determining whether or not the data read from the memory cell is correct.

14. The test method according to claim 10, wherein the read parameter is a latency for reading the data of the memory cell.

15. A test method for testing a memory device including a memory cell, the test method comprising:

storing a first value; and executing at a given timing to include:

determining a second value which is a threshold limit value to read data of the memory cell correctly on the basis of an output of the memory cell;

calculating a difference between the first value and the second value;

outputting a deterioration information on the basis of the difference between the first value and the second value; and updating the first value stored in the storage to the second value, wherein the determining a second value includes repeating an operation including:

setting a write parameter to the memory device;

writing data to the memory cell using the write parameter;

reading the data of the memory cell on the basis of the output from the memory cell using a read parameter which is set in the memory device;

judging whether or not the data of the memory cell which is read using the read parameter is correct; and changing a value of the write parameter, when the data of the memory cell is judged to be correct, so that the value of the write parameter deviates from a threshold value provided under normal operating conditions to simulate an environment severer than an environment under the normal operating conditions under which it becomes severer to read the data of the memory cell on the basis of the output from the memory cell; and detecting the second value from values of the write parameter, each of which is set when the data of the memory cell is judged to be correct in the operation.

* * * * *